United States Patent
Unruh et al.

(10) Patent No.: US 9,859,903 B2
(45) Date of Patent: Jan. 2, 2018

(54) METHOD AND APPARATUS FOR FAST PHASE LOCKED LOOP (PLL) SETTLING WITH REDUCED FREQUENCY OVERSHOOT

(71) Applicant: Avago Technologies General IP (Singapore) Pte. Ltd.

(72) Inventors: Greg Alyn Unruh, San Clemente, CA (US); Pin-En Su, Irvine, CA (US); Fazil Ahmad, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/010,571

(22) Filed: Jan. 29, 2016

(65) Prior Publication Data

US 2017/0201260 A1 Jul. 13, 2017

Related U.S. Application Data (60) Provisional application No. 62/276,584, filed on Jan. 8, 2016.

(51) Int. Cl.
*H03L 7/06* (2006.01)
*H03L 7/099* (2006.01)
*G04F 10/00* (2006.01)

(52) U.S. Cl.
CPC .......... *H03L 7/0994* (2013.01); *G04F 10/005* (2013.01)

(58) Field of Classification Search
CPC ..... H03L 7/0994; H03L 7/097; H03L 7/0992; H03L 7/1974; H03L 7/081; G04F 10/005
USPC .............. 327/141, 144–163; 375/371–376; 331/1 R, 16–18, 25, 34, 44, 57, 107 R, 331/108 R, 109, 108 B, 108 C, 108 D, 331/135–137, 175, 176, 185, 187; 455/129, 130
See application file for complete search history.

(56) References Cited

U.S. PATENT DOCUMENTS 8,207,770 B1 * 6/2012 Ravi ................. H03L 7/085
327/150

\* cited by examiner

*Primary Examiner* — Lincoln Donovan
*Assistant Examiner* — Thomas Skibinski
(74) *Attorney, Agent, or Firm* — Sterne, Kessler, Goldstein & Fox P.L.L.C.

(57) ABSTRACT

Method and apparatus for fast phase locked loop (PLL) settling with reduced frequency overshoot are provided. During acquisition, a first phase offset signal configured to drive a phase error signal to zero is provided at a first circuit of the PLL. The first circuit may be a time-to-digital converter (TDC) of the PLL. A second phase offset signal configured to offset the first phase offset signal is provided at a second circuit of the PLL. The second circuit of the PLL may be a loop filter at the PLL.

21 Claims, 8 Drawing Sheets

METHOD AND APPARATUS FOR FAST PHASE LOCKED LOOP (PLL) SETTLING WITH REDUCED FREQUENCY OVERSHOOT

CROSS-REFERENCE TO RELATED APPLICATIONS

The present application claims the benefit of U.S. Provisional Application No. 62/276,584, filed Jan. 8, 2016, which is incorporated herein by reference in its entirety.

TECHNICAL FIELD

The present disclosure relates generally to phase locked loops (PLLs).

BACKGROUND

Increasing demand for power saving in computer systems has made techniques like Dynamic Frequency Scaling (DFS) and Dynamic Voltage and Frequency Scaling (DVFS) highly popular. These techniques work by lowering the frequency of the clock signal provided to a processor, and by consequence allow for the voltage provided to the processor to be lowered.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

The present disclosure will be described with reference to the accompanying drawings. Generally, the drawing in which an element first appears is typically indicated by the leftmost digit(s) in the corresponding reference number.

DETAILED DESCRIPTION OF EMBODIMENTS

Increasing demand for power saving in computer systems has made techniques like Dynamic Frequency Scaling (DFS) and Dynamic Voltage and Frequency Scaling (DVFS) highly popular. These techniques work by lowering the frequency of the clock signal provided to a processor, and by consequence allow for the voltage provided to the processor to be lowered.

Efficiency of DFS and DVFS is increased when the clock signal provided to the processor can reach a new target frequency as quickly as possible. In addition, it is desirable that the processor be able to switch to a new target frequency without interruption. This translates into clocking circuitry requirements (commonly phase locked loop (PLL) circuits) of fast settling with reduced frequency overshoot.

Figure 1:
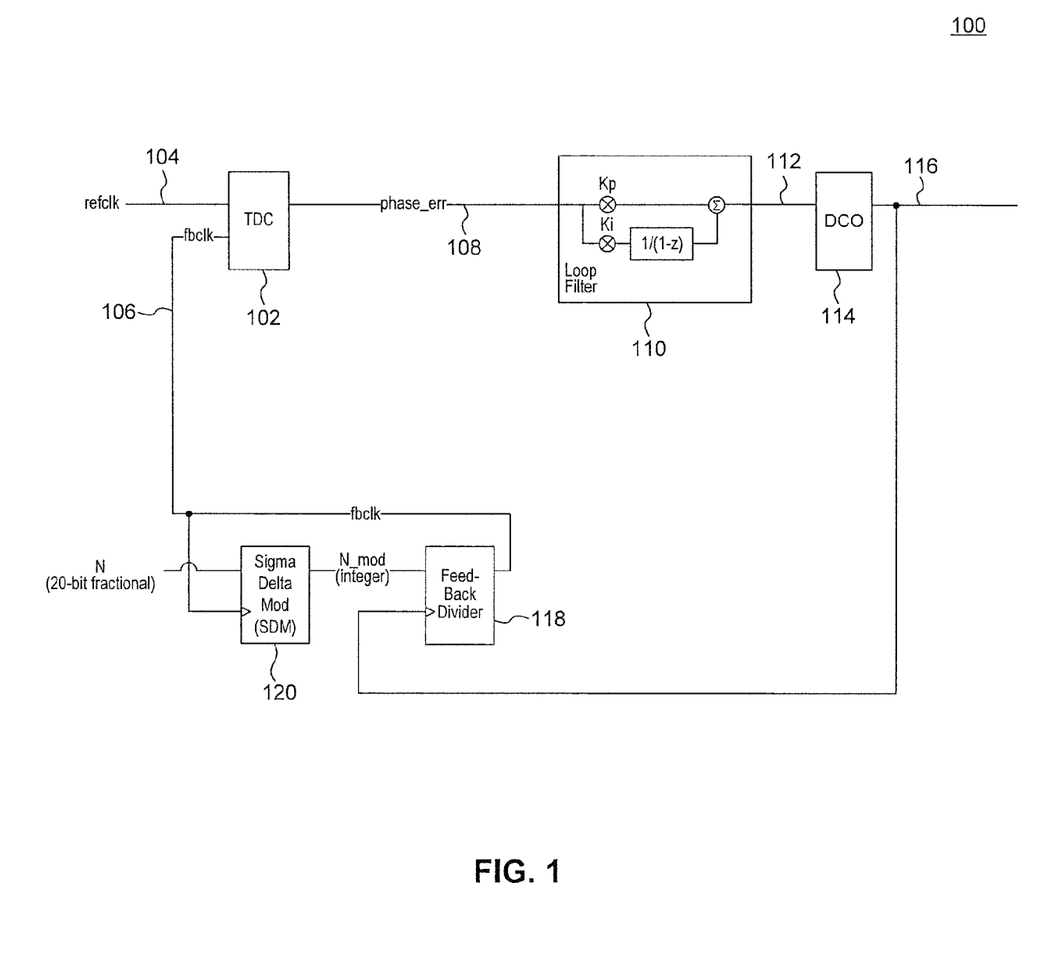
FIG. 1 illustrates an example Type-2 digital phase locked loop (DPLL).

FIG. 1 illustrates an example Type-2 digital phase locked loop (DPLL) 100. Example DPLL 100 is provided for the purpose of illustration only and is not limiting of embodiments. As shown in FIG. 1, example DPLL 100 includes a time-to-digital converter (TDC) 102, a loop filter 110, a digitally controlled oscillator (DCO) 114, a feedback divider 118, and a Sigma-Delta Modulator (SDM) 120.

TDC 102 receives a reference clock signal 104 and a feedback clock signal 106 from feedback divider 118. TDC 102 generates a phase error signal 108 that represents the phase difference between reference clock signal 104 and feedback clock signal 106. Phase error signal 108 is provided to loop filter 110, which filters phase error signal 108 to generate filtered phase error signal 112. Typically, loop filter 110 integrates phase error signal 108 and generates filtered phase error signal 112 as an average of phase error signal 108.

Filtered phase error signal 112 controls DCO 114, which generates DPLL output clock signal 116. Output clock signal 116 is fed back to feedback divider 118. Feedback divider 118 divides output clock signal 116 by an integer divider (N_mod) received from SDM 120 to generate feedback clock signal 106. SDM 120 allows integer or fractional division of output clock signal 116 by generating the integer divider N_mod based on a divider input of value N, where N may be an integer or fractional number.

Operation of example DPLL 100 as described above results in a negative feedback control system whereby the value of phase error signal 108 is driven to zero. Because frequency is the time derivative of phase, the frequency difference between reference clock signal 104 and feedback clock signal 106 is also driven to zero. This results in output clock signal 116 having a frequency equal to N times the frequency of reference clock signal 104, where N is the value of the divider input of SDM 120.

Figure 2:
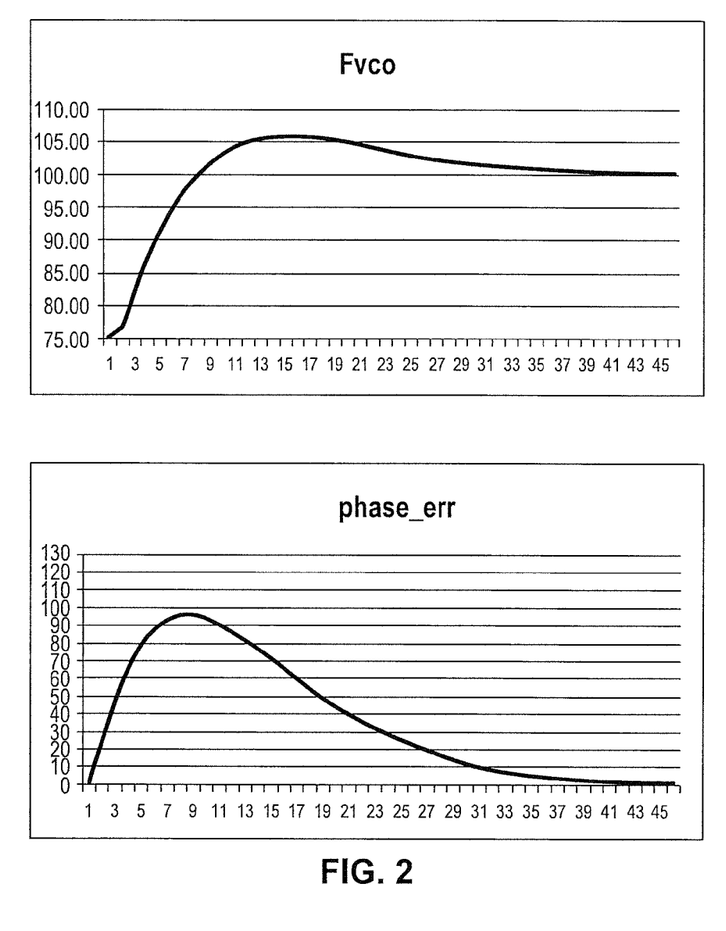
FIG. 2 illustrates example Type-2 PLL settling behavior.

FIG. 2 illustrates example Type-2 PLL settling behavior. For the purpose of illustration, this example assumes a reference clock signal frequency of 1 MHz, a divider input N=100, loop filter proportional gain constant Kp=0.2 and integral gain constant Ki=0.015, and a zero-phase start (i.e., phase error=0 at T=0). The top graph shows the instantaneous frequency of output clock signal 116 (output clock frequency). The bottom graph illustrates the behavior of phase error signal 108 (phase error).

As shown in FIG. 2, when acquisition is initiated, the phase error rises rapidly. DCO 114 reacts to the accumulating phase error by increasing the output clock frequency at a high rate. This results in the output clock frequency overshooting the target frequency of 100 MHz, until the phase error is driven down to zero at settling time.

Output clock frequency overshoots can cause operational failures in digital circuits due to insufficient timing margin. Frequency overshoots in Type-2 PLLs may not be completely avoided, but may be reduced by adjusting the loop filter constants, e.g., decreasing the integral gain constant Ki. However, this comes at the expense of increasing settling time.

Figure 3:
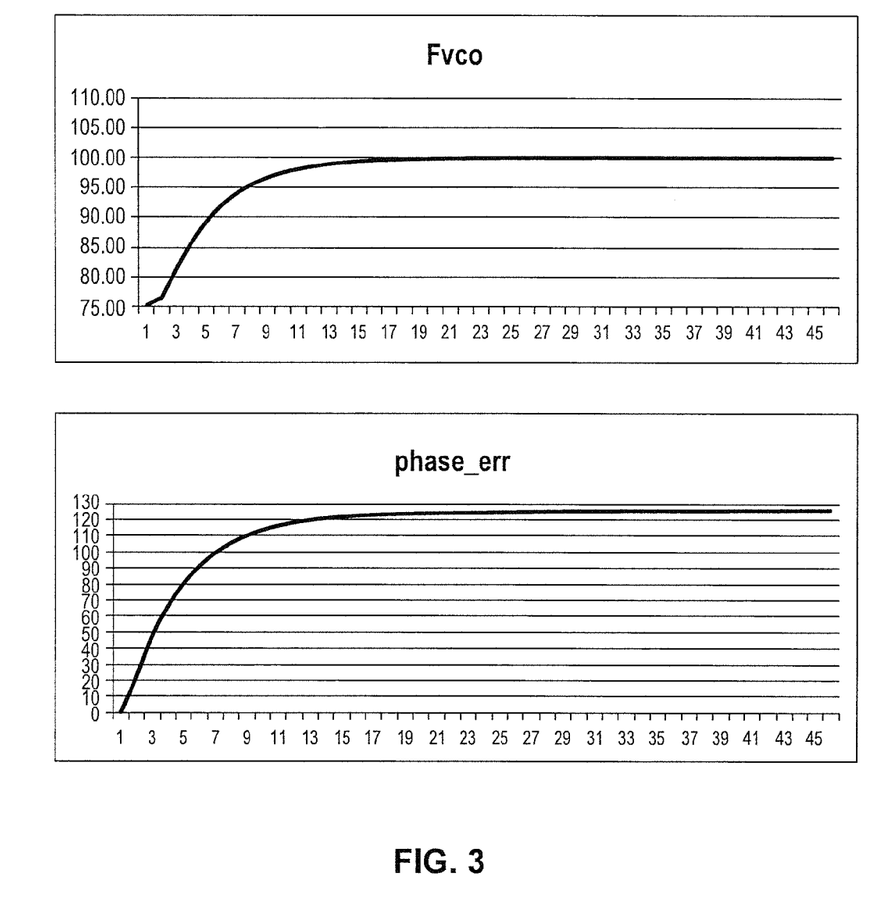
FIG. 3 illustrates example Type-1 PLL settling behavior.

In the extreme case, the integral gain constant Ki can be set to zero to disable the integrator path of loop filter 110, effectively resulting in a Type-1 PLL. FIG. 3 illustrates example Type-1 PLL settling behavior. For the purpose of illustration, the same conditions as described above with reference to FIG. 2 are assumed, with the exception of the integral gain constant Ki being set to zero.

As shown in FIG. 3, the output clock frequency asymptotically approaches the target frequency, with no frequency overshoot, in Type-1 PLLs. But the phase error never subsides and continues to be non-zero in steady state. Steady-state phase error can be reduced in Type-1 PLL by increasing the DC gain of the PLL. However, this increases the PLL's bandwidth and reduces the PLL's ability to filter the phase error signal.

Without the ability to eliminate frequency overshoots (without increasing settling time or running a steady-state phase error), one approach includes pausing/disabling the processor's operation until lock is achieved onto the target frequency using a Type-2 or higher PLL. However, this solution is inefficient since the processor is interrupted each time that a new target frequency is selected.

Figure 4:
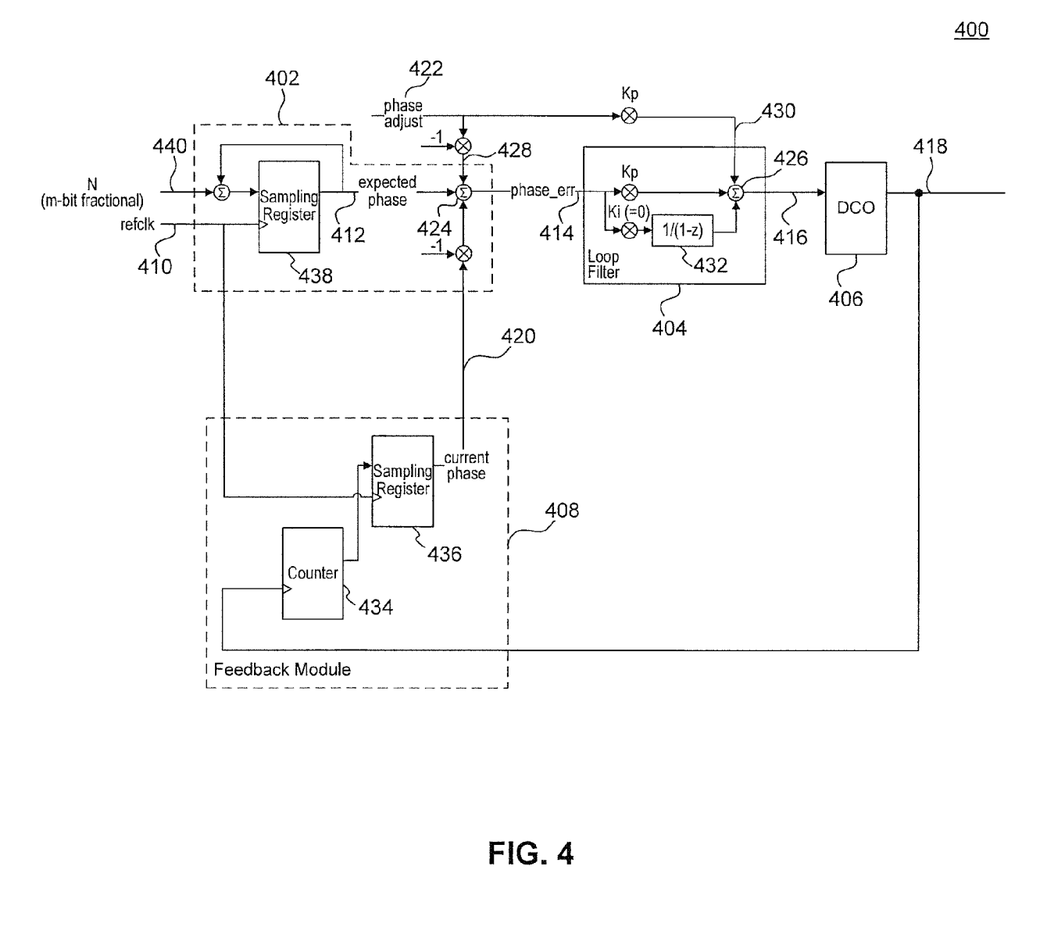
FIG. 4 illustrates an example DPLL according to an embodiment.

FIG. 4 illustrates an example DPLL 400 according to an embodiment of the disclosure. Example DPLL 400 is provided for the purpose of illustration only and is not limiting of embodiments. As shown in FIG. 4, example DPLL 400 may include a TDC 402, a loop filter 404, a DCO 406, and a feedback circuit 408.

In an embodiment, TDC 402 is configured to receive a reference clock signal 410 and a current phase signal 420 from feedback circuit 408. Based on reference clock signal 410 and current phase signal 420, TDC 402 generates a phase error signal 414. In an embodiment, TDC 402 integrates a divider input N 440 to generate an expected phase signal 412. In an embodiment, this is performed using a sampling register 438 and a positive feedback loop that couples the output terminal of sampling register 438 via a summing node to its data input terminal that receives divider input N 440. In another embodiment, TDC 402 uses sampling register 438, clocked by reference clock signal 410, to count an expected number of clock cycles that output clock signal 418 is expected to undergo between a predetermined time, T0, and the most recent clock cycle of reference clock signal 410. Expected phase signal 412 corresponds to the count of sampling register 438.

Using a summing node 424, TDC 402 subtracts current phase signal 420 from expected phase signal 412 to generate phase error signal 414. Phase error signal 414 is input into loop filter 404, which generates a filtered phase error signal 416 based on phase error signal 414. In an embodiment, loop filter 404 is a proportional-integral (PI) filter having a proportional path with a proportional gain constant Kp and an integral path with an integral gain constant Ki and an integrator circuit 432. In an embodiment, the integral gain constant Ki is set to zero during acquisition mode, disabling the integral path and emulating Type-1 PLL operation. This eliminates the undesired output clock frequency overshoot behavior exhibited in Type-2 PLLs. Ki can be maintained at zero or set to a non-zero value after acquisition to operate DPLL 400 as a Type-1 or Type-2 PLL.

Filtered phase error signal 416 is provided to DCO 406, which generates output clock signal 418 of DPLL 400 based on filtered phase error signal 416. Output clock signal 418 is fed back to feedback circuit 408 to generate current phase signal 420. In an embodiment, feedback circuit 408 includes a counter 434 and a sampling register 436. In an embodiment, counter 434 counts the actual number of clock cycles of output clock signal 418 that occur between a predetermined time, T0, and the most recent clock cycle of reference clock signal 410. Sampling register 436 is clocked by reference clock signal 410 to provide the output of counter 434 as current phase signal 420. In an embodiment, feedback circuit 408 may be configured to determine fractional phase difference between reference clock signal 410 and output clock signal 418.

In another embodiment, TDC 402 may further receive a first phase offset signal 428 at summing node 424. In an embodiment, first phase offset signal 428 is generated as the negative of a phase adjust signal 422. In this embodiment, TDC 402 generates phase error signal 414 as a sum of first phase offset signal 428 and a difference between expected phase signal 412 and current phase signal 420. In an embodiment, first phase offset signal 428 is configured to be equal to the negative of the difference between expected phase signal 412 and current phase signal 420. As such, first phase offset signal 428 drives phase error signal 414 toward zero, resulting in zero steady-state phase error.

To eliminate the effect on output clock signal 418 of first phase offset signal 428, a second phase offset signal 430 is provided at loop filter 404. In an embodiment, second phase offset signal 430 is provided at an output summing node 426 of loop filter 404 and is added to the output of loop filter 404. Second phase offset signal 430 is configured to offset first phase offset signal 428 in filtered phase error signal 416. As would be understood by a person of skill in the art based on the teachings herein, first phase offset signal 428 and second phase offset signal 430 may be provided at different points within DPLL 400 without departing from the scope of the embodiments described herein. For example, instead of providing first phase offset signal 428 at TDC 402, feedback circuit 408 may be configured to receive first phase offset signal 428 such that a similar or same effect is achieved on phase error signal 414.

In an embodiment, second phase offset signal 430 is configured to be equal to the negative of first phase offset signal 428, multiplied by the proportional gain constant Kp of loop filter 404. In another embodiment, second phase offset signal 430 is generated by multiplying phase adjust signal 422 by the proportional gain constant Kp of loop filter 404. In addition to being related in terms of magnitude, in an embodiment, first phase offset signal 428 and second phase offset signal 430 are latency matched such that their respective effects on filtered phase error signal 416 coincide in time cancelling each other. This may include delay matching the circuit paths resulting in first phase offset signal 428 and second phase offset signal 430.

Figure 5:
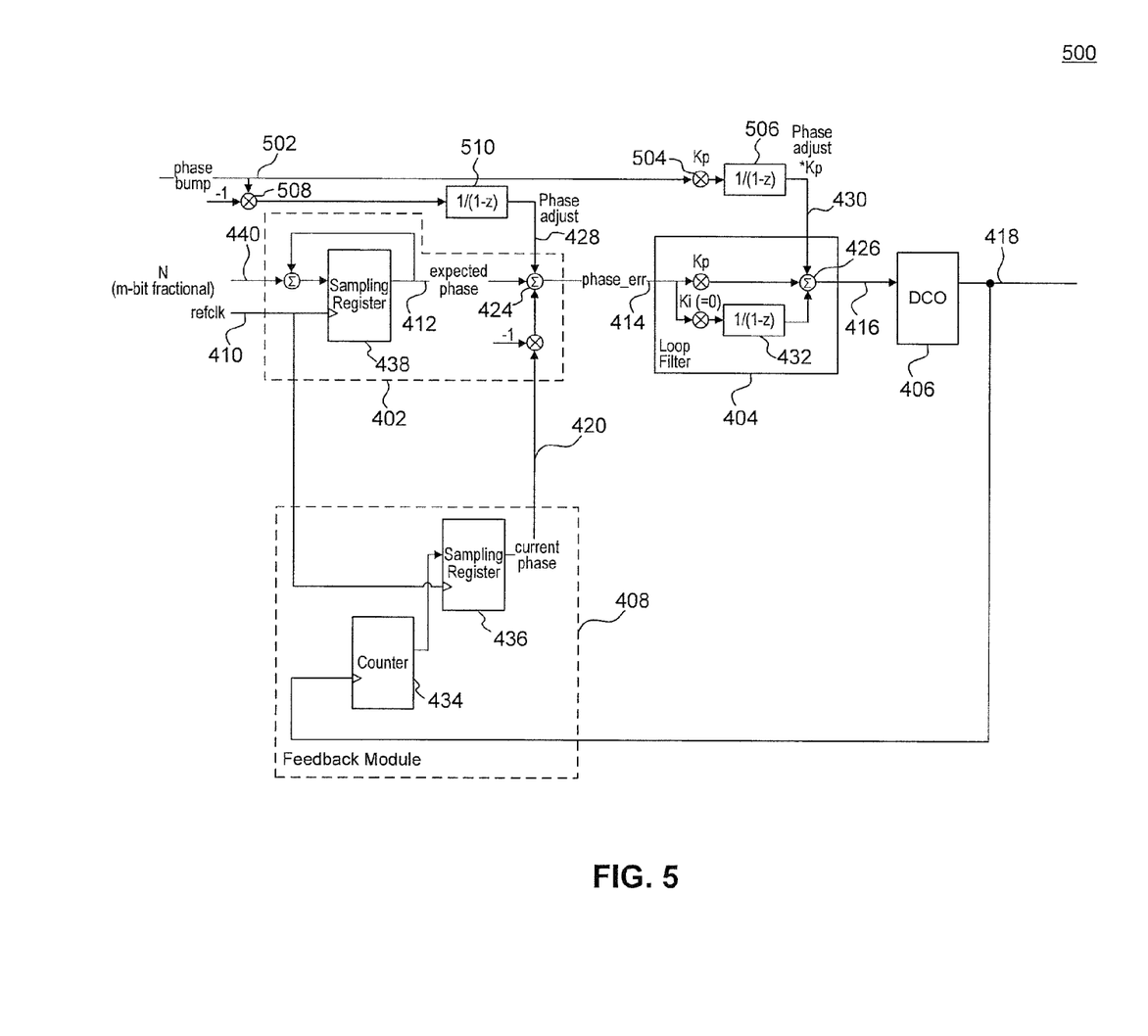
FIG. 5 illustrates an example DPLL according to an embodiment.

FIG. 5 illustrates another example DPLL 500 according to an embodiment. Example DPLL 500 is provided for the purpose of illustration only and is not limiting of embodiments. Example DPLL 500 includes similar elements as example DPLL 400 described above. Additionally, example DPLL 500 includes a first accumulator circuit 506 and a second accumulator circuit 510.

First accumulator circuit 506 and second accumulator circuit 510 allow for first phase offset signal 428 and second phase offset signal 430 to be generated by integrating a phase bump signal 502 that is smaller than the phase error, rather than from a static phase adjustment signal (e.g., phase adjust signal 422) equal to the phase error.

In an embodiment, as shown in FIG. 5, phase bump signal 502 is multiplied by the proportional gain constant Kp of loop filter 404 using a multiplier 504. The resulting multiple of phase bump signal 502 is integrated by first accumulator circuit 506 to generate second phase offset signal 430. In another embodiment, multiplier 504 can be placed after first accumulator circuit 506. As such, first accumulator circuit 506 integrates phase bump signal 502, and the integration result is multiplied by the proportional gain constant Kp using multiplier 504 to generate second phase offset signal 430.

To generate first phase offset signal 428, the negative of phase bump signal 502 is generated using a multiplier 508 and then integrated by second accumulator circuit 510. Alternatively, phase bump signal 502 can be integrated by second accumulator circuit 510, and the integration result multiplied using multiplier 508 to generate the negative thereof.

First phase offset signal 428 and second phase offset signal 430 are used as described above with reference to FIG. 4 to eliminate residual phase error in DPLL 500.

Figure 6:
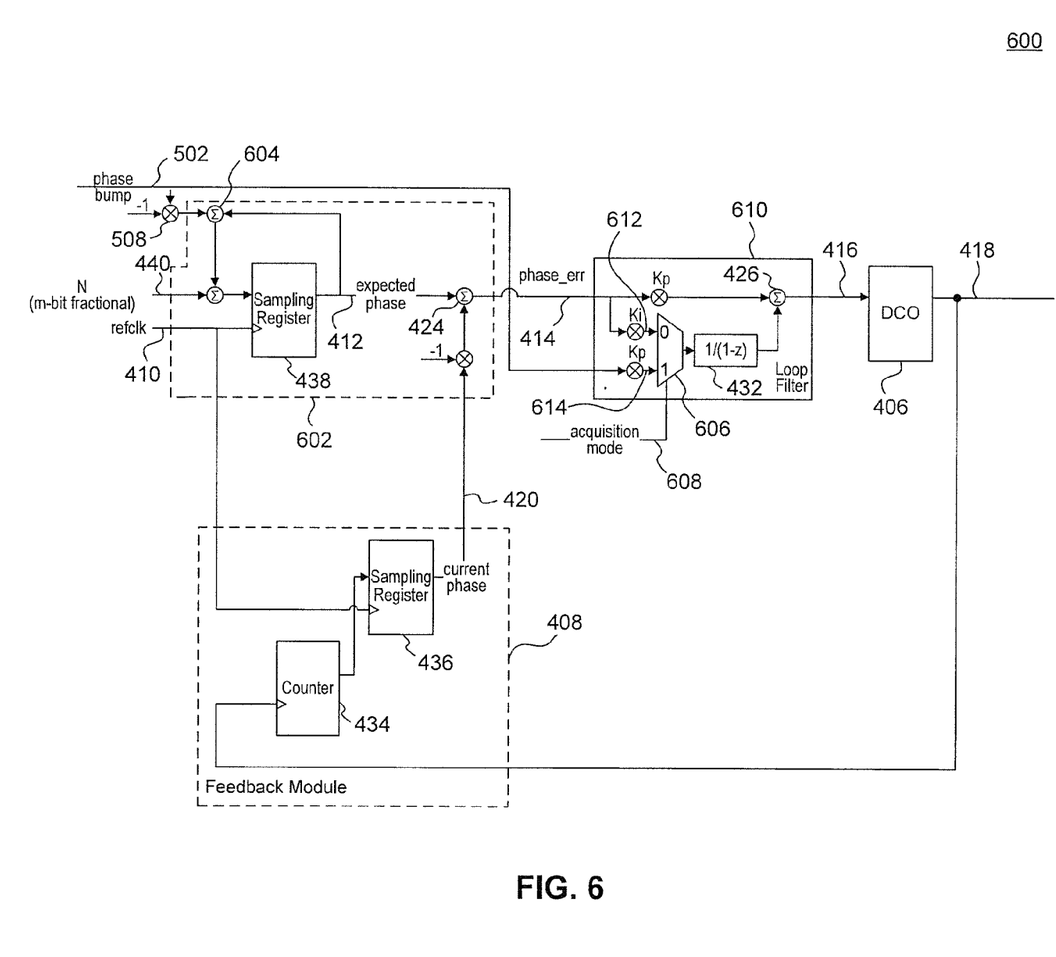
FIG. 6 illustrates an example DPLL according to an embodiment.

FIG. 6 illustrates another example DPLL 600 according to an embodiment. Example DPLL 600 is provided for the purpose of illustration only and is not limiting of embodiments. Example DPLL 600 includes similar elements as example DPLL 500 described above. In contrast, however, first accumulator circuit 506 and second accumulator circuit 510 are eliminated, and their respective functions are merged into a loop filter 610 and a TDC 602 respectively.

With respect to TDC 602, the integration functionality of second accumulator 510 is merged into the integrator provided by the sampling register and feedback loop of TDC 602. For this reason, a summing node 604 is provided within TDC 602 to receive the negative of phase bump signal 502 as an input of the sampling register. This implementation is in contrast to previously described embodiments in which first phase offset 428 is provided at summing node 424 at the output of TDC 402. Otherwise, TDC 602 operates in similar manner to TDC 402 described above.

Loop filter 610 includes a multiplexer 606 that is configured to receive as inputs an integral path signal 612 and a gained phase bump signal 614, resulting from multiplying phase bump signal 502 by the proportional gain constant Kp of loop filter 610. A control signal 608 controls multiplexer 606 to select one of signals 612 and 614 as output for integrator circuit 432.

During acquisition mode, gained phase bump signal 614 is selected by multiplexer 606, resulting in gained phase bump signal 614 being integrated by integrator circuit 432. This is equivalent to the accumulation performed by first accumulator circuit 506 in example DPLL 500 described above. After acquisition, integral path signal 612 is selected by multiplexer 606. Depending on the value of the integral gain constant Ki, DPLL 600 can operate as a Type-1 or a Type-2 PLL.

Figure 7:
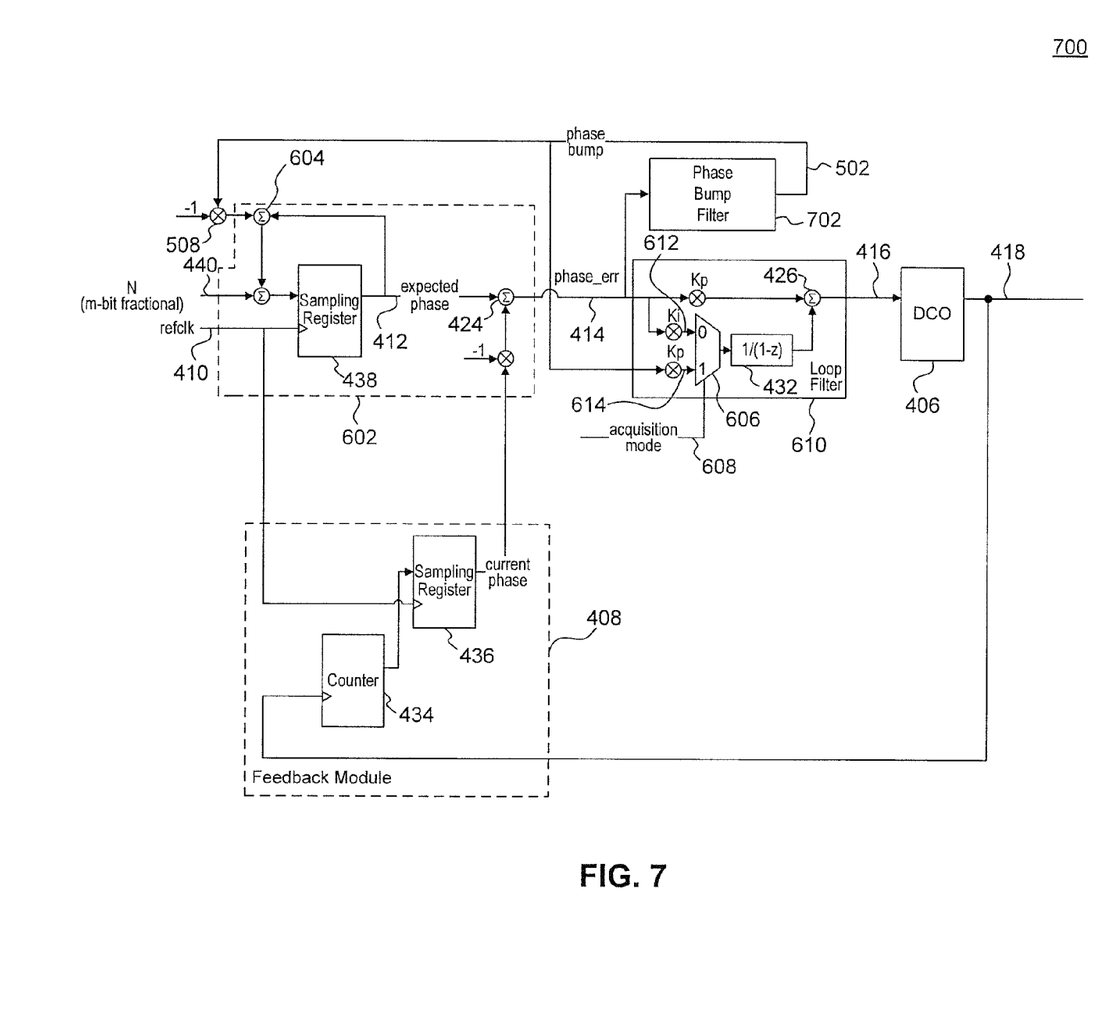
FIG. 7 illustrates an example DPLL according to an embodiment.

FIG. 7 illustrates another example DPLL 700 according to an embodiment. Example DPLL 700 is provided for the purpose of illustration only and is not limiting of embodiments. Example DPLL 700 includes similar elements as example DPLL 600 described above. In addition, DPLL 700 includes a phase bump filter 702 that is configured to generate phase bump signal 502 based on phase error signal 414.

In an embodiment, phase bump filter 702 generates phase bump signal 502 as a fraction (e.g., ½, ¼, etc.) of phase error signal 414. This causes phase error signal 414 to asymptotically approach zero. In another embodiment, phase bump filter 702 generates phase bump signal as equal to +1 when phase error signal 414 is positive and as equal to −1 when phase error signal 414 is negative.

Phase bump filter 702 may be configured to generate integer or integer and fractional outputs depending on whether phase error signal 414 includes an integer only or an integer and fractional value.

Figure 8:
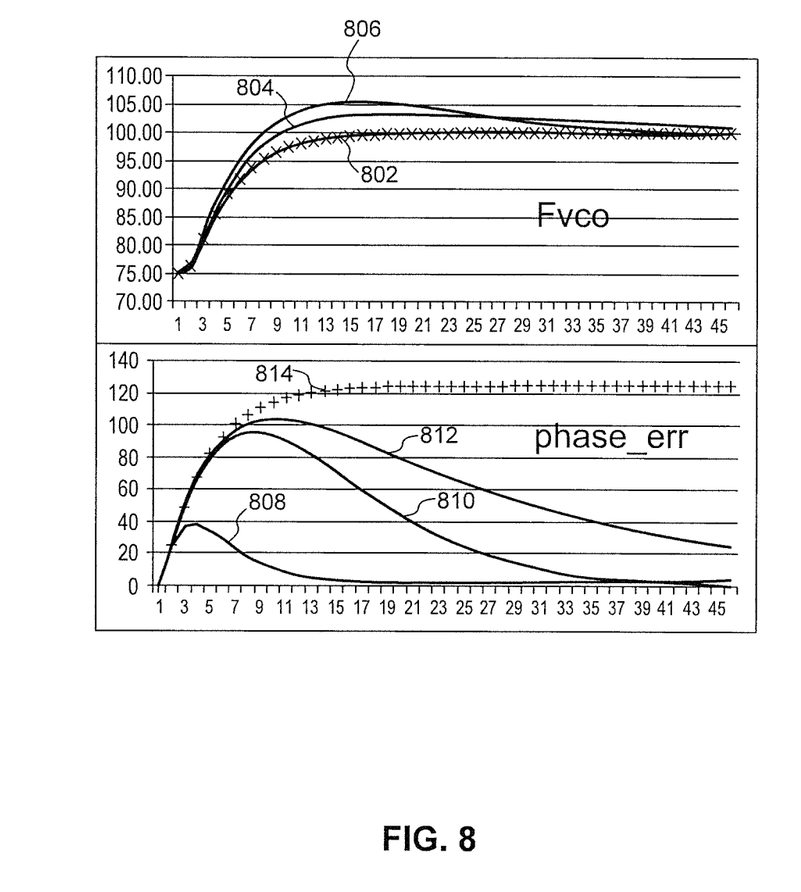
FIG. 8 illustrates example settling behavior of a PLL according to an embodiment.

FIG. 8 illustrates example settling behavior of a PLL according to an embodiment of the present disclosure. This example is provided for the purpose of illustration only and is not limiting of embodiments. The behavior of the example PLL embodiment is illustrated by curves 802 and 808. For comparison, the behavior of a Type-1 PLL (illustrated by curves 802 and 814), a higher Ki Type-2 PLL (illustrated by curves 806 and 810), and a lower Ki Type-2 PLL (illustrated by curves 804 and 812) are also shown.

As shown FIG. 8, the example PLL embodiment has similar behavior to a Type-1 PLL (curve 802) with respect to the output clock frequency of the PLL. Specifically, the output clock frequency asymptotically approaches the target frequency, with no frequency overshoot. The example PLL embodiment thus achieves faster settling than Type-2 PLLs.

In contrast to Type-1 PLLs, however, the phase error is driven down rapidly to zero by settling time, resulting in no steady-state phase error. The example PLL embodiment also outperforms Type-2 PLLs with respect to the phase error, thereby achieving faster phase lock.

As a result of the above described performance advantages, embodiments allow for digital operations to be started while the PLL is still locking to a target frequency (no risk of damaging frequency overshoot). In addition, faster transitions between target frequencies and uninterrupted operation during transitions changes can be achieved. This increases the power efficiency of power saving schemes, such as DFV and DVFS, for example.

Embodiments are described above with respect to digital PLLs. As would be understood by a person of skill in the art based on the teachings herein, embodiments can be readily extended to analog PLLs and are not limited to DPLLs. For example, in an analog equivalent of example DPLL 400, first phase offset 428 is provided at a phase detector or a phase-frequency detector (PFD) of the PLL and second phase offset 430 is provided at a loop filter in the forward path of the PLL. In another embodiment, first phase offset 428 is provided in the feedback path (e.g., feedback divider) of the PLL and second phase offset 430 is provided at an analog summing node in the forward path of the PLL (e.g., output of phase detector or loop filter). Phase error in the PLL can thus be driven down to zero without affecting the input/output of a voltage controlled oscillator (VCO) of the PLL.

For the purposes of this discussion, the term "processor circuitry" shall be understood to include one or more: circuit(s), processor(s), or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to embodiments described herein. Alternatively, the processor can access an internal or external memory to retrieve instructions stored in the memory, which when executed by the processor, perform the corresponding function(s) associated with the processor.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments as other embodiments will be apparent to a person of skill in the art based on the teachings herein.

What is claimed is:

1. A digital phase locked loop (DPLL), comprising:
   a time-to-digital converter configured to generate a phase error signal based on a reference clock signal, a current phase signal, and a first phase offset signal, the first phase offset signal being configured to drive the phase error signal toward zero;
   a loop filter configured to generate a filtered phase error signal based on the phase error signal and a second phase offset signal, the second phase offset signal being configured to offset the first phase offset signal in the filtered phase error signal; and
   a digitally controlled oscillator (DCO) configured to generate an output clock signal of the DPLL based on the filtered phase error signal,
   wherein the second phase offset signal is equal to a negative of the first phase offset signal, multiplied by a proportional gain constant of the loop filter.

2. The DPLL of claim 1, further comprising:
   a feedback circuit configured to generate the current phase signal based on the output clock signal of the DPLL.

3. The DPLL of claim 2, wherein the feedback circuit is further configured to determine a fractional phase difference between the reference clock signal and the output clock signal of the DPLL.

4. The DPLL of claim 1, wherein the time-to-digital converter is further configured to:
   generate an expected phase signal based on the reference clock signal; and
   generate the phase error signal as a sum of the first phase offset signal and a difference between the expected phase signal and the current phase signal.

5. The DPLL of claim 1, further comprising:
   a first accumulator circuit configured to integrate a multiple of a phase bump signal to generate the second phase offset signal; and
   a second accumulator circuit configured to integrate a negative of the phase bump signal to generate the first phase offset signal.

6. The DPLL of claim 5, wherein the first accumulator circuit includes an integrator circuit of the loop filter.

7. The DPLL of claim 5, wherein the second accumulator circuit includes a sampling register of the time-to-digital converter.

8. The DPLL of claim 1, wherein the loop filter includes:
   an output summing node configured to add the second phase offset signal at an output of the loop filter to generate the filtered phase error signal.

9. A method of operating a digital phase locked loop (DPLL), comprising:
   generating a phase error signal based on a reference clock signal, a current phase signal, and a first phase offset signal, the first phase offset signal being configured to drive the phase error signal toward zero;
   generating a filtered phase error signal based on the phase error signal and a second phase offset signal, the second phase offset signal being configured to offset the first phase offset signal in the filtered phase error signal; and
   generating an output clock signal of the DPLL based on the filtered phase error signal,
   wherein the second phase offset signal is equal to a negative of the first phase offset signal, multiplied by a proportional gain constant of a loop filter that generates the filtered phase error signal.

10. The method of claim 9, further comprising:
    generating the current phase signal based on the output clock signal of the DPLL.

11. The method of claim 9, further comprising:
    generating an expected phase signal based on the reference clock signal; and
    generating the phase error signal as a sum of the first phase offset signal and a difference between the expected phase signal and the current phase signal.

12. The method of claim 9, further comprising:
    integrating a multiple of a phase bump signal to generate the second phase offset signal; and
    integrating a negative of the phase bump signal to generate the first phase offset signal.

13. The method claim 9, further comprising determining a fractional phase difference between the reference clock signal and the output clock signal of the DPLL.

14. The method of claim 9, wherein generating the filtered phase error signal comprises adding the second phase offset signal at an output of a loop filter to generate the filtered phase error signal.

15. A digital phase locked loop (DPLL), comprising:
    a time-to-digital converter configured to generate a phase error signal based on a reference clock signal and a first phase offset signal;
    a loop filter configured to generate a filtered phase error signal based on the phase error signal and a second phase offset signal;
    a first accumulator circuit configured to receive a phase bump signal and integrate a multiple of the phase bump signal to generate the second phase offset signal; and
    a second accumulator circuit configured to receive a negative of the phase bump signal and integrate the negative of the phase bump signal to generate the first phase offset signal.

16. The DPLL of claim 15, further comprising:
    a digitally controlled oscillator (DCO) configured to generate an output clock signal of the DPLL based on the filtered phase error signal.

17. The DPLL of claim 15, wherein the second phase offset signal is configured to offset the first phase offset signal in the filtered phase error signal.

18. The DPLL of claim 15, further comprising:
    a feedback circuit configured to generate a current phase signal based on the output clock signal of the DPLL.

19. The DPLL of claim 18, wherein the feedback circuit is further configured to determine a fractional phase difference between the reference clock signal and the output clock signal of the DPLL.

20. The DPLL of claim 18, wherein the time-to-digital converter is further configured to:
   generate an expected phase signal based on the reference clock signal; and
   generate the phase error signal as a sum of the first phase offset signal and a difference between the expected phase signal and the current phase signal.

21. The DPLL of claim 15, wherein the first accumulator circuit includes an integrator circuit of the loop filter.

\* \* \* \* \*